US012785704B2

(12) United States Patent
Seah et al.

(10) Patent No.: US 12,785,704 B2
(45) Date of Patent: Nov. 3, 2026

(54) PHASE-LOCKED LOOP WITH IMPROVED PROCESS, FREQUENCY, AND TEMPERATURE INDEPENDENCE

(71) Applicant: Silicon Laboratories Inc., Austin, TX (US)

(72) Inventors: Yun Da Bryan Seah, Singapore (SG); Hua Beng Chan, Singapore (SG); Tak Ying Wong, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 127 days.

(21) Appl. No.: 18/657,254

(22) Filed: May 7, 2024

(65) Prior Publication Data

US 2025/0350287 A1 Nov. 13, 2025

(51) Int. Cl.
*H03L 7/099* (2006.01)
*H03L 7/089* (2006.01)
*H03L 7/107* (2006.01)

(52) U.S. Cl.
CPC .......... *H03L 7/0992* (2013.01); *H03L 7/0891* (2013.01); *H03L 7/1075* (2013.01)

(58) Field of Classification Search
CPC ... H03L 7/0992; H03L 7/1075; H03L 7/0891; H03L 7/197
USPC .................................................. 375/373–376
See application file for complete search history.

(56) References Cited

U.S. PATENT DOCUMENTS

| | | | |
|---|---|---|---|
| 7,386,749 | B2 | 6/2008 | Rifani et al. |
| 7,889,477 | B2 | 2/2011 | Neubarth |
| 8,773,184 | B1 | 7/2014 | Petrov |
| 9,024,667 | B1 | 5/2015 | Fu |
| 9,246,500 | B2 | 1/2016 | Perrott |
| 10,122,378 | B2 | 11/2018 | Kim |

(Continued)

OTHER PUBLICATIONS

Maneatis, J., "Low-Jitter and Process-Independent DLL and PLL Based on Self-Biased Techniques," ISSCC96/Session8/Digital Clocks and Latches/Paper FA 8.1, Feb. 9, 1996, 3 pages.

(Continued)

*Primary Examiner* — Qutbuddin Ghulamali
(74) *Attorney, Agent, or Firm* — Zagorin Cave LLP

(57) ABSTRACT

A technique for reducing effects of variations in process, voltage, and temperature (PVT) on the performance of a fractional-N frequency synthesizer includes making loop parameters, e.g., damping factor $\zeta$ and loop bandwidth $\omega_N$, first-order independent of PVT variations. In an embodiment of a fractional-N frequency synthesizer, a voltage-controlled oscillator is implemented using a ring-oscillator realized by an odd number of inverter stages. By making the loop parameters a multiple of frequency $f_{REF}$ and a ratio of components (e.g., $C_1/C_{st}$, where capacitance $C_{st}$ represents the load of each stage of the ring oscillator) and self-biasing the phase-locked loop, the technique makes the ratio of loop bandwidth $\omega_n$ to the operating frequency $f_{CLKOUT}$ constant in response to PVT variations.

18 Claims, 9 Drawing Sheets

(56) References Cited

U.S. PATENT DOCUMENTS

| | | | | |
|---|---|---|---|---|
| 10,623,008 | B2 * | 4/2020 | Upadhyaya | H03L 7/18 |
| 2013/0187690 | A1 * | 7/2013 | Feng | H03L 7/0893 327/157 |
| 2016/0322979 | A1 * | 11/2016 | Upadhyaya | H03L 7/197 |

OTHER PUBLICATIONS

Meninger, S. and Perrott, M., "A 1-MHZ Bandwidth 3.6-GHz 0.18-μm CMOS Fractional-N Synthesizer Utilizing a Hybrid PFD/DAC Structure for Reduced Broadband Phase Noise," IEEE Journal of Solid-State Circuits, Apr. 2006, pp. 966-980, vol. 41, No. 4.

U.S. Appl. No. 18/657,260, filed May 7, 2024, entitled "Charge Injection Reduction in a Fractional-N Frequency Synthesizer," by inventors Yun Da Bryan Seah et al.

U.S. Appl. No. 18/657,069, filed May 7, 2024, entitled "Noise Down Conversion for Jitter Reduction," by inventors Yun Da Bryan Seah et al.

* cited by examiner

PHASE-LOCKED LOOP WITH IMPROVED PROCESS, FREQUENCY, AND TEMPERATURE INDEPENDENCE

CROSS-REFERENCE TO RELATED APPLICATION(S)

This application is related to U.S. patent application Ser. No. 18/657,260, filed on May 7, 2024, entitled "CHARGE INJECTION REDUCTION IN A FRACTIONAL-N FREQUENCY SYNTHESIZER," naming Yun Da Bryan Seah, et al. as inventors, now U.S. Pat. No. 12,537,532, and this application is related to U.S. patent application Ser. No. 18/657,069, filed on May 7, 2024, entitled "NOISE DOWN CONVERSION FOR JITTER REDUCTION," naming Yun Da Bryan Seah et al., as inventors, which applications are hereby incorporated by reference in their entirety.

BACKGROUND

Field of the Invention

This invention relates to frequency synthesizers and more particularly to noise reduction in a phase-locked loop included in a fractional-N frequency synthesizer or clock generator.

Description of the Related Art

In general, variations in manufacturing process, voltage, or temperature (PVT) of an integrated circuit implementation of a phase-locked loop causes variation in loop parameters of the phase-locked loop and degrades the timing and noise characteristics of clock signals generated using the phase-locked loop. Accordingly, techniques that reduce or eliminate dependencies of phase-locked loop characteristics (e.g., damping factor and the ratio of the loop bandwidth to reference frequency) on PVT variations are desired.

SUMMARY OF EMBODIMENTS OF THE INVENTION

In at least one embodiment, a method for fractional-N frequency synthesis includes generating a charge-pump current using a bias signal generated based on a control voltage of a voltage-controlled oscillator of a phase-locked loop and a frequency divider value of the phase-locked loop. The method may include generating the bias signal based on the control voltage and the frequency divider value of the phase-locked loop. The method may include providing the bias signal to a current generation circuit in a charge pump of the phase-locked loop. The method may include generating an additional bias signal for a cascode device of the current generation circuit in the charge pump. The additional bias signal may be generated based on the control voltage and the frequency divider value. The method may include generating the control voltage based on the charge-pump current and using a loop filter capacitance and a selected loop filter resistance. The method may include configuring the selected loop filter resistance according to the frequency divider value. The selected loop filter resistance may vary according to variation of the control voltage. The loop filter capacitance may be a replica of a load of an individual stage of a ring oscillator of the voltage-controlled oscillator.

In at least one embodiment, a fractional-N frequency synthesizer includes a phase-locked loop having a charge pump comprising a current generation circuit responsive to a bias signal. The phase-locked loop includes a voltage-controlled oscillator responsive to a control signal. The fractional-N frequency synthesizer includes a bias signal generator configured to generate the bias signal based on the control voltage and a frequency divider value. The phase-locked loop may include a loop filter configured to generate the control signal. The loop filter may include a loop filter capacitance and a selectable loop filter resistance. The selectable loop filter resistance may be configured according to the frequency divider value and may vary according to variation of the control signal. The loop filter capacitance may be a replica of a load of an individual stage of a ring oscillator of the voltage-controlled oscillator. The bias signal generator may include a selectable current mirror configured to generate the bias signal according to a current based on the control signal and based on a control code corresponding to the frequency divider value. The selectable current mirror may be configured to generate a cascode bias signal according to the current based on the control signal and the control code corresponding to the frequency divider value.

In an embodiment, a method for fractional-N frequency synthesis includes generating a control voltage for a voltage-controlled oscillator in a phase-locked loop based on an output of a charge pump. The control voltage is generated using a loop filter capacitance that is a replica of a load of an individual stage of a ring oscillator of the voltage-controlled oscillator and using a selectable loop filter resistor configured according to a frequency divider value. The selectable loop filter resistor has a resistance that is a function of the control voltage. The method may include generating a bias signal based on the control voltage and the frequency divider value. The method may include generating the output of the charge pump based on the bias signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
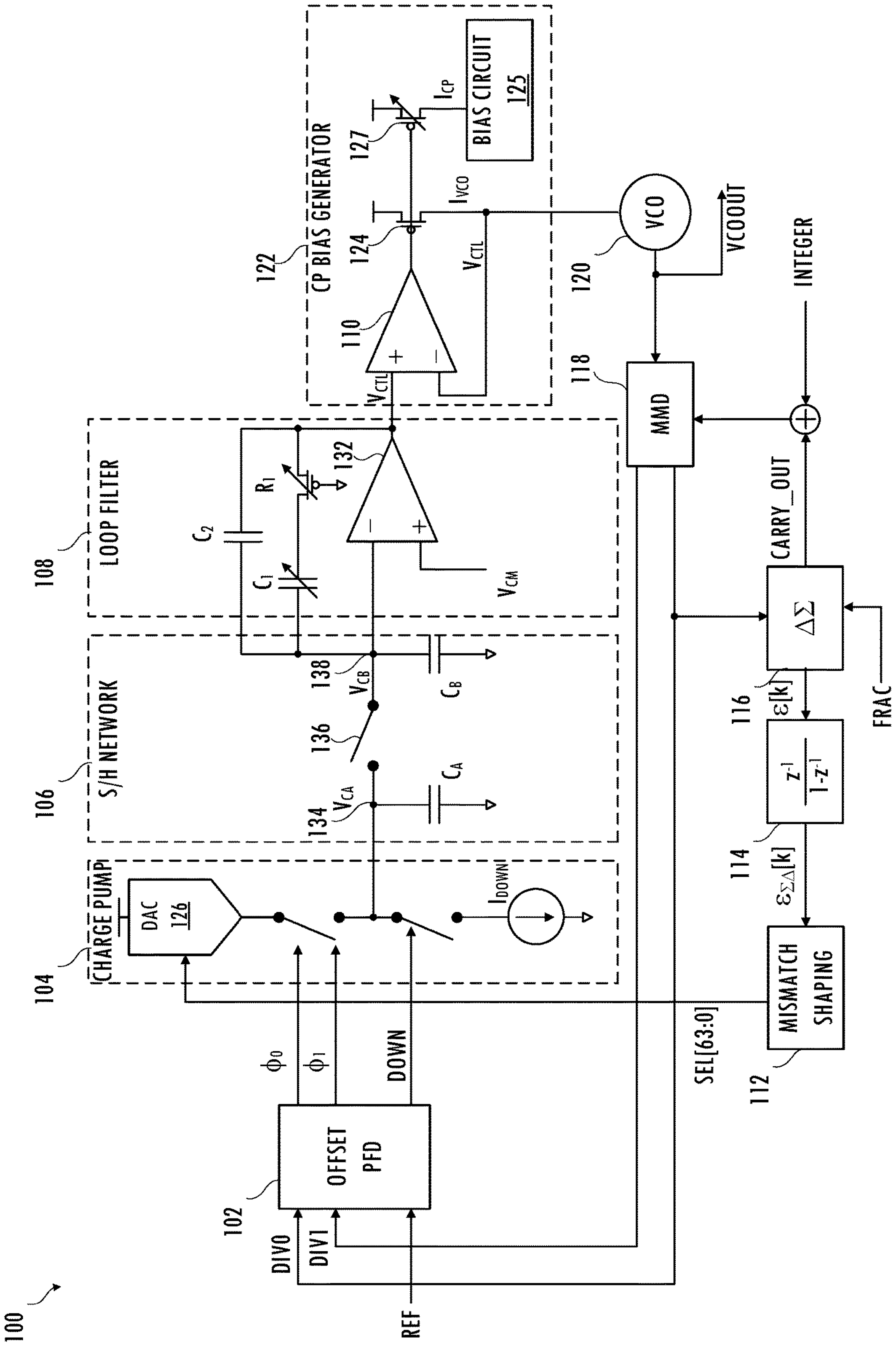
FIG. 1 illustrates a functional block diagram of an embodiment of a fractional-N frequency synthesizer.
Figure 2:
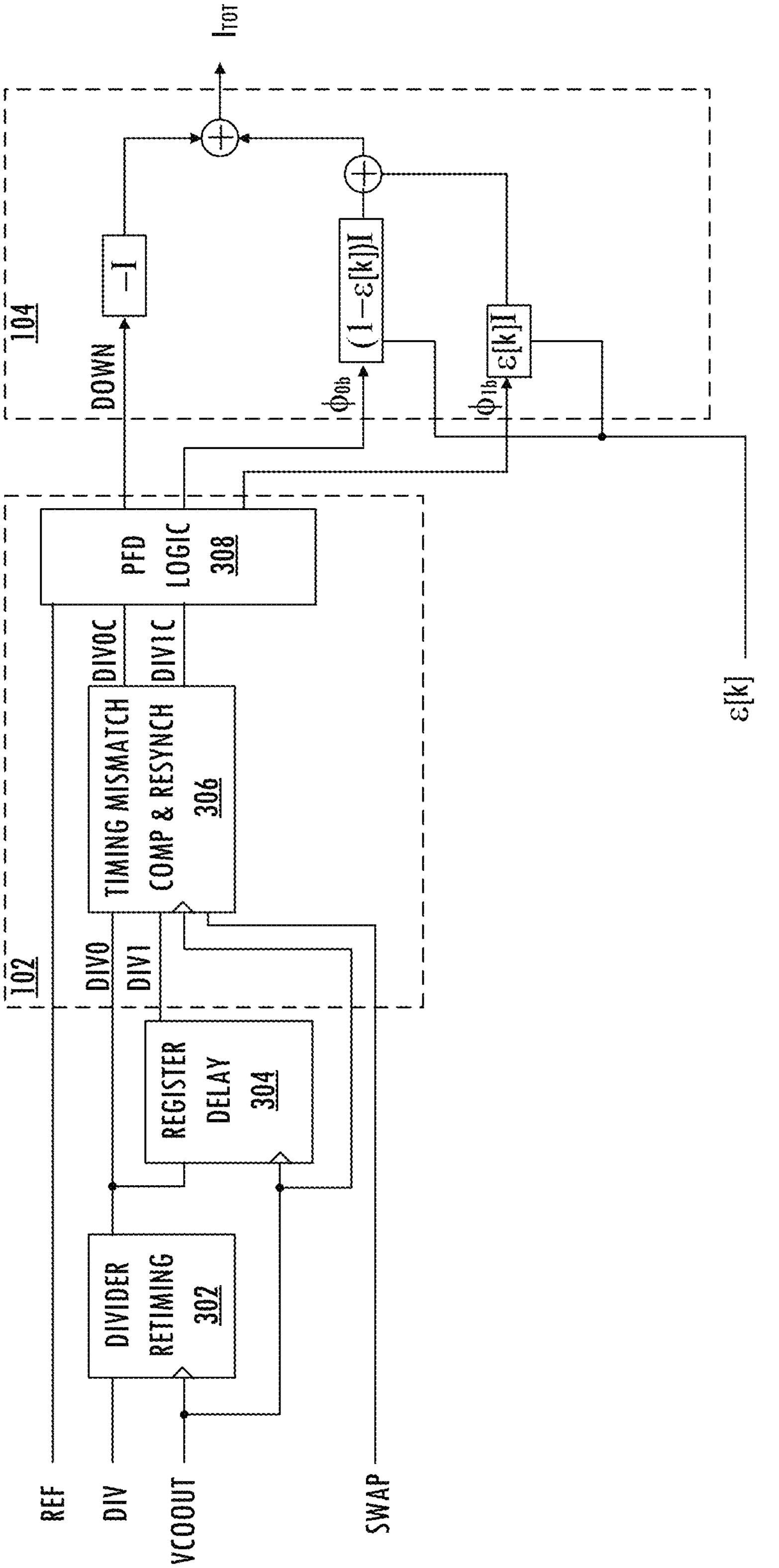
FIG. 2 illustrates a functional block diagram of an offset tri-state phase-frequency detector and charge pump of an embodiment of a fractional-N frequency synthesizer.
Figure 3:
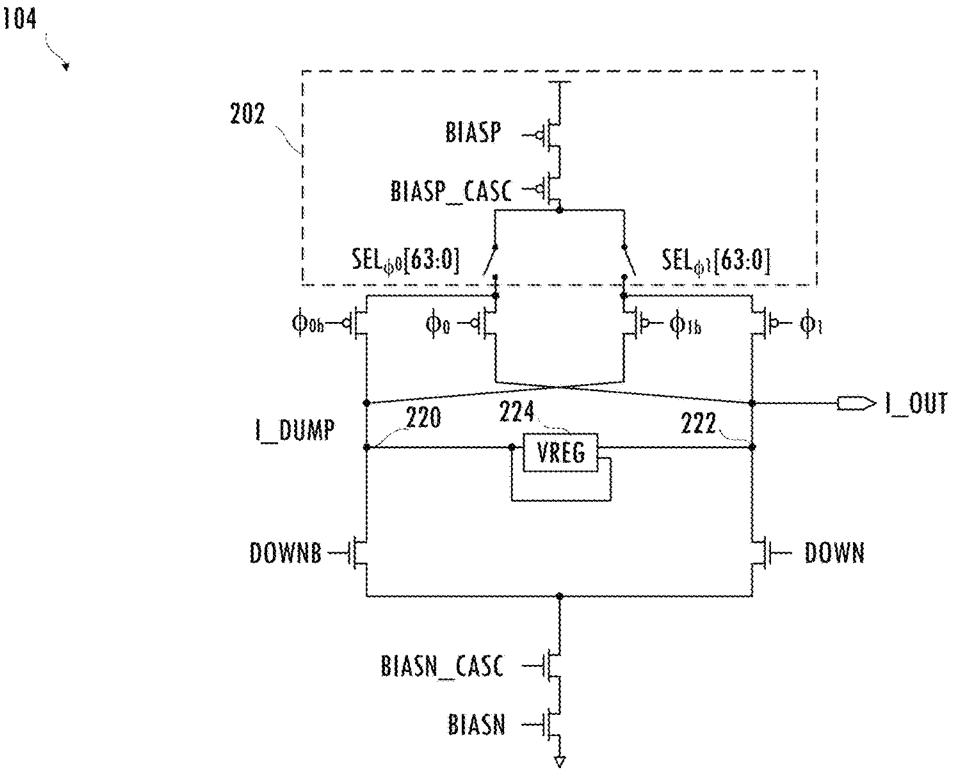
FIG. 3 illustrates a circuit diagram of a charge pump of an embodiment of a fractional-N frequency synthesizer.

Referring to FIGS. 1, 2, and 3, fractional-N frequency synthesizer 100 generates clock signal VCOOUT having a frequency $f_{VCO}$ that is INTEGER.FRAC times frequency $f_{REF}$ of reference clock signal REF. Fractional-N frequency synthesizer 100 includes offset tri-state phase-frequency detector 102, which detects a frequency and phase difference between reference clock signal REF and frequency-divided signals DIV0 and DIV1 and generates pulse control signals (e.g., error cancellation phase signal $\phi_0$, full-scale phase signal $\phi_1$, and control signal DOWN) based on the frequency and phase difference. Frequency-divided signal DIV0 corresponds to a retimed version of the frequency divided signal DIV, which is clock signal VCOOUT frequency divided by frequency divider value N. Frequency-divided signal DIV1 corresponds to a retimed version of the frequency divided signal DIV delayed by one cycle of clock signal VCOOUT, which is generated by voltage-controlled oscillator 120. In an embodiment, frequency-divided signal DIV0 is generated by divider-retiming circuit 302, which may be included in offset tri-state phase-frequency detector 102 or in frequency divider 118. In other embodiments, divider-retiming circuit 302 is excluded and frequency-divided signal DIV0 is clock signal VCOOUT frequency divided by frequency divider value N and frequency-divided signal DIV1 is a version of frequency-divided signal DIV0 that is delayed by one cycle of clock signal VCOOUT.

Offset tri-state phase-frequency detector 102 provides error cancellation phase signal $\phi_0$ (or its complementary signal, error cancellation phase signal $\phi_{0b}$), full-scale phase signal $\phi_1$ (or its complementary signal, error cancellation phase signal $\phi_{1b}$), and control signal DOWN to charge pump 104, which implements digital-to-analog conversion and generates an error signal on node 134. To achieve the digital-to-analog conversion functionality, charge pump 104 implements two charge pumps associated with the frequency-divided signals as a shared digital-to-analog converter (DAC) current source that is controlled using select signals SEL$\phi_0$ and SEL$\phi_1$, which are based on a predicted value of fractional phase error ε[k]. The value of fractional phase error ε[k] is based on the residue of an accumulator used to dither a divider value, which is consistent with conventional phase interpolation techniques.

Referring to FIGS. 1, 2, 4A, 4B, and 4C, charge pump 104 has a degree of freedom to adjust the area of each current pulse $I_{UP}$, which is a pulse of positively charged current corresponding to charge $Q_U$. Current pulse $I_{DOWN}$ is a pulse of negatively charged current corresponding to charge $Q_D$, which is active in time for one period of clock signal VCOOUT (i.e., $T_{VCO}$), takes on the value I(1+ε[k]) rather than I. The combination of the positive and negative current pulses achieves an overall output charge of zero. For example, $$I\cdot(T_u+\varepsilon[k]T_{VCO}-T_{VCO})+I\cdot(1-\varepsilon[k])T_{VCO}-I\cdot t_{del}=I\cdot T_u-I\cdot t_{del}=0,$$

where $T_u$ is defined to be the minimum pulse-width of the up pulse and is constant under steady-state conditions and $t_{del}$ is the constant width of the negatively charged current pulse set by a delay circuit in phase-frequency detector logic circuit 308. Under steady-state conditions, the phase-locked loop of fractional-N frequency synthesizer 100 adjusts $T_u$ to achieve the overall output charge of zero, i.e., the combined area of current pulse $I_{DOWN}$ and current pulse $I_{UP}$ is zero for each cycle. That is, as fractional-N dithering changes the pulse-width of the current pulse $I_{UP}$, the phase-locked loop varies the amount of charge delivered to compensate for error in an interval that has a width of $T_{VCO}$, thereby maintaining charge balance every period. Offset tri-state phase-frequency detector 102 and charge pump 104 achieve this charge balance in a self-aligned manner, thus no calibration is required. Offset tri-state phase-frequency detector 102 and charge pump 104 maintain equal and opposite charge for each of the up and down current pulses so that the net charge transferred to loop filter 108 and the input of voltage-controlled oscillator 120 is zero.

Figure 4A:
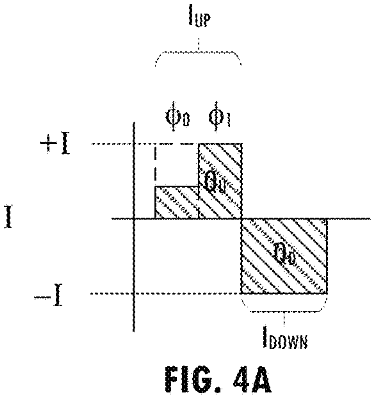
FIGS. 4A, 4B, 4C illustrate current pulses for one cycle of a reference clock output by a charge pump for an embodiment of a fractional-N frequency synthesizer, an ideal charge-box, and an actual charge-box with mismatch, respectively.
Figure 4B:
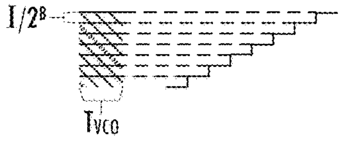
Figure 4C:

The ability of this technique to completely cancel quantization noise is determined by the accuracy of generating the variable current window having a width of $T_{VCO}$ at the beginning of current pulse $I_{UP}$. Since the integral of current over time is charge, the variable current window is referred to herein as a charge-box. To generate the charge-box, its time duration is set to $T_{VCO}$, and the current magnitude is set to I(1−ε[k]). Ideally, the charge-box has a time duration of $T_{VCO}$ and is broken up into equally spaced current increments of $I/2^B$ for a B-bit phase-frequency detector and digital-to-analog conversion (FIG. 4B). In practice, circuits generating the charge-box are susceptible to timing mismatch (i.e., having a time duration for the charge-box that is different from $T_{VCO}$ by a time offset of $\Delta_t$, e.g., caused by mismatches between the registers and routing paths associated with frequency-divided signals DIV0 and DIV1) and magnitude mismatch (i.e., unequal division of current values within the charge-box, e.g., caused by mismatch between the current elements of DAC 126 used to implement the scaling operations) (FIG. 4C).

Figure 5:
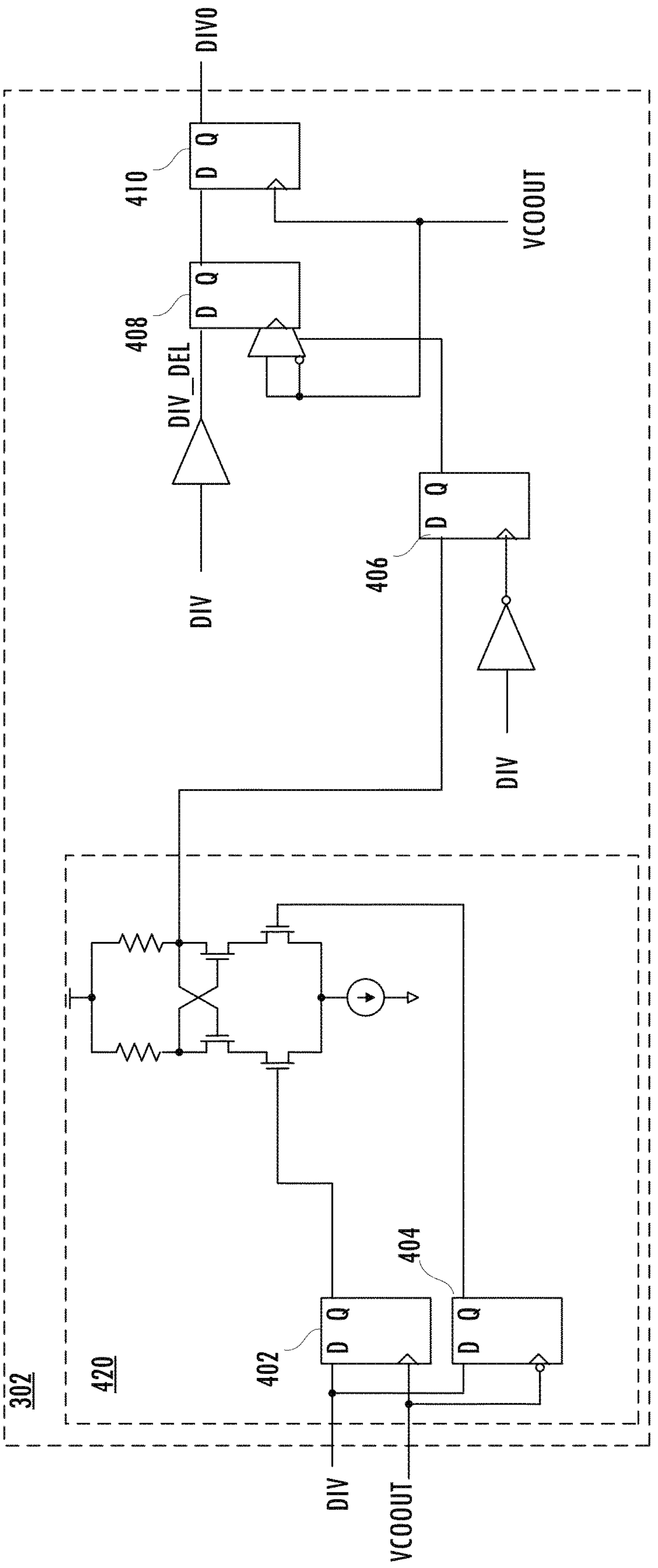
FIG. 5 illustrates a circuit diagram of an exemplary divider retiming circuit of an embodiment of an offset tri-state phase-frequency detector in an embodiment of a fractional-N frequency synthesizer.

Referring to FIGS. 1, 2, and 5, offset tri-state phase-frequency detector 102 implements techniques to counteract timing and magnitude mismatch including divider retiming and dynamic element matching of the current elements of DAC 126 that cause the charge-box to be self-aligned on average with respect to achieving a time duration of $T_{VCO}$ and having equally spaced current increments of $I/2^B$. In an embodiment, divider retiming circuit 302 (described further below) aligns the frequency divided signal to clock signal VCOOUT. For example, divider retiming circuit 302 aligns frequency-divided signal DIV0 to clock signal VCOOUT. Register delay 304 is controlled by clock signal VCOOUT and delays frequency-divided signal DIV0 by one cycle of clock signal VCOOUT to generate frequency-divided signal DIV1. However, mismatches in the registers and layout paths associated with frequency-divided signals DIV0 and DIV1 leads to residual timing mismatch $\Delta_t$, which affects performance in some embodiments of a fractional-N frequency synthesizer. In at least one embodiment, timing mismatch compensation circuit 306 reduces the residual timing mismatch by swapping the paths that frequency-divided signals DIV0 and DIV1 take through phase-frequency detector logic circuit 308 and charge pump circuit 104. Mismatch shaping circuit 112 scrambles the mapping between the residue provided by accumulator 114 and current elements of DAC 126, thereby shaping mismatch-induced noise to high frequencies. The scrambling prevents noise folding of first-order shaped quantization noise. Sample-and-hold network 106 reduces or eliminates the influence of charge pump current pulses on loop filter 108 and VCO 120, thereby reducing or eliminating fractional spurs due to periodic changes in the shape of the current pulses, and reducing the magnitude of a reference spur.

In general, multi-modulus dividers used in high-speed frequency synthesizer designs are asynchronous in nature in order to reduce power dissipation. As a result, the relative phase between clock signal VCOOUT and the frequency-divided signals DIV0 and DIV1 varies substantially as a function of process, temperature, and divide value variations. Referring to FIGS. 1, 2, and 5, to reduce or eliminate meta-stability problems when retiming the output of divider 118, offset tri-state phase-frequency detector 102 includes divider retimer circuit 302 having timing arbiter circuit 420 that selects either the rising edges or the falling edges of clock signal VCOOUT as the retiming signal according to which edges reduce the probability of incurring meta-stability in a re-timing register.

An embodiment of divider retiming circuit 302 directly determines the likelihood of a meta-stable event and re-times the divided signal accordingly. In an embodiment, due to the high speed of clock signal VCOOUT, logic in divider retimer circuit 302 is implemented using resistively loaded, source coupled logic (SCL) (i.e., current mode logic (CML)). When the circuit is active, timing arbiter circuit 420 evaluates whether rising edge triggered flip-flop 402 or falling edge triggered flip-flop 404 generates a valid output level first. Flip-flop 406, which is a simple, low-speed finite state machine, controls retiming flip-flop 408 having an input that is a delayed version of the divider output. The delay is designed to be slightly more than a setup-and-hold time to give some margin when retiming. Retiming flip-flop 408 is clocked by the opposite phase of clock signal VCOOUT from timing arbiter circuit 420. The combination of delaying the divider and controlling the retiming with the opposite phase of clock signal VCOOUT at flip-flop 408 ensures valid retiming for different possible meta-stable conditions at timing arbiter circuit 420. The output of divider retiming circuit 302 is provided by flip-flop 410, which is always clocked on the rising edge of clock signal VCOOUT. Accordingly, frequency-divided signal DIV0, and therefore the charge-box, is always referred to the rising edge of clock signal VCOOUT. In at least one embodiment, selection of the edge of clock signal VCOOUT used by flip-flop 408 is locked during times in which the noise performance of the fractional-N frequency synthesizer is critical to avoid possible variation in frequency-divided signal DIV0 that could occur if timing arbiter circuit 420 is operating at the edge of a given selection region. This strategy may be useful for embodiments in burst-mode communication applications in which clock signal VCOOUT is not required continuously. In an embodiment, time delay $t_{del}$ is long enough to accommodate environmental drift during times that the choice of the edge of clock signal VCOOUT used by flip-flop 408 is locked.

Figure 6:
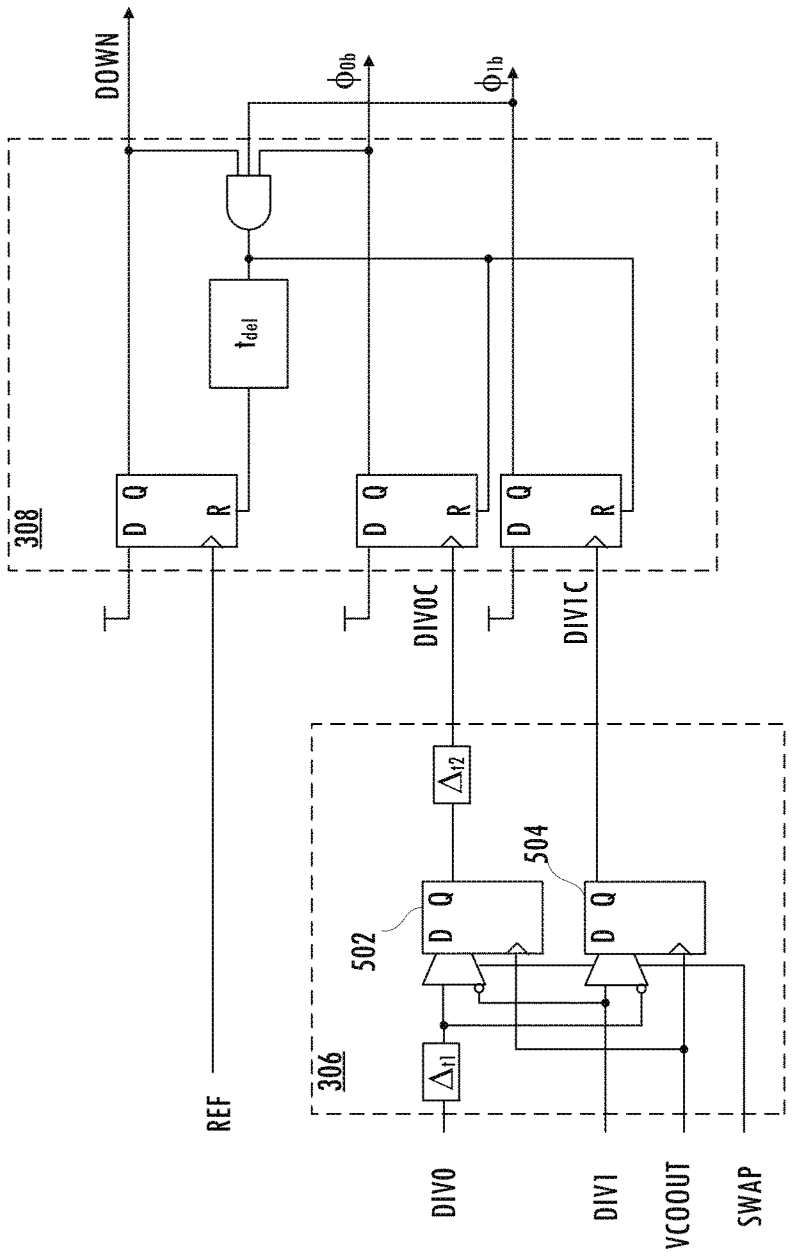
FIG. 6 illustrates a circuit diagram of an exemplary timing mismatch compensation circuit and phase-frequency detector logic circuit of an embodiment of an offset tri-state phase-frequency detector in an embodiment of a fractional-N frequency synthesizer.

In an embodiment, the time duration of the charge-box is set by the timing difference between frequency-divided signal DIV0 and frequency-divided signal DIV1. Any mismatch in delay between these two paths corrupts the charge-box, and results in incomplete quantization noise suppression, which may affect performance in some applications. Referring to FIGS. 1, 2, and 6, in at least one embodiment, timing mismatch compensation circuit 306 reduces the effect of such timing mismatch. Timing mismatch compensation circuit 306 achieves matching delay paths by dynamically swapping their routing through phase-frequency detector logic circuit 308 in a pseudo-random fashion such that they both use each path for the same amount of time, on average. The residue error processed by the DAC current sources is swapped according to control signal SWAP. Thus, the charge-box has a set average time duration of $T_{VCO}$ without calibration. The swapping approach generates noise since the charge-box instantaneously varies in time duration according to which swap path is selected.

The level of this timing-mismatch-induced noise depends on the magnitude of the timing mismatch. In at least one embodiment, timing mismatch compensation circuit 306 separates the timing mismatch into two components, $\Delta_{t1}$ and 412, which correspond to mismatch delay before swapping registers 502 and 504 and mismatch delay after swapping registers 502 and 504, respectively. Since swapping registers 502 and 504 align their outputs to their clock input, the impact of $\Delta_{t1}$ is negligible. However, $\Delta_{t2}$ directly influences the charge-box time duration and is reduced in order to reduce the amount of noise generated in the swapping process. Pseudo-random control of signal SWAP results in a white power spectral density for the timing-mismatch induced noise. For example, an embodiment uses a 23-register linear feedback shift register to produce a randomized signal that has an average duty cycle of 0.5. The impact of this noise on overall synthesizer phase noise performance can be calculated based on known PLL parameters and an estimate of the residual time mismatch. In other embodiments of the fractional-N frequency synthesizer, a phase swapping technique shapes the mismatch noise to reduce its in-band impact. Phase-frequency detector logic circuit 308 receives resynchronized signals DIV0C and DIV1C from timing mismatch compensation circuit 306 and uses flip-flops implemented by SCL logic to generate fast edge rates and to establish a well-defined charge-box at high frequencies (e.g., 3.6 GHz). In an embodiment, swapping registers 502 and 504 integrate phase swapping muxes into their flip-flop input latch stages to reduce power consumption and area and to increase operating speed. In some embodiments, (e.g., lower performance embodiments), divider-retiming circuit 302 and timing mismatch compensation circuit 306 are excluded and frequency-divided signal DIV0 is frequency divider output DIV, and signals DIV0 and DIV1 are provided directly to phase-frequency detector logic circuit 308. In some embodiments (e.g., lower performance embodiments), SCL logic is not used.

Referring to FIG. 1, magnitude mismatch caused by variations between current elements of DAC 126 create variable current levels within the charge-box and nonlinearity in the output of DAC 126, which fold quantization noise produced by sigma-delta modulator 116 and induce fractional spurs in CLKOUT due to the periodic components of the accumulator residue present in its output. To counteract such issues, mismatch shaping circuit 112 scrambles the mapping of inputs to DAC 126 to the current elements such that nonlinearity in the output of DAC 126 is reduced or eliminated on average and scrambles mismatch noise to reduce or eliminate fractional spurs by shaping them to high frequencies, thereby reducing or eliminating its impact on in-band PLL noise. In at least one embodiment, mismatch shaping circuit 112 generates phase select signals $SEL\phi_0[63:0]$ and $SEL\phi_1[63:0]$ using a thermometer decoder and data weighted averager (DWA) that perform a modified barrel shift of the current elements of DAC 126 as they are utilized by the system over successive periods.

Referring to FIGS. 1 and 3, in at least one embodiment, current elements of charge pump 104 have a differential structure to enable fast switching. Nodes 220 and 222 form a differential pair of nodes of charge pump 104. In an embodiment of charge pump 104, circuit portion 202 is instantiated for each individually selectable unit cell of the charge pump (e.g., 64 cells). Other circuitry of charge pump 104 is shared by the charge pump unit cells. Phase select signals SEL$\phi_0$[63:0] and SEL$\phi_1$[63:0] choose whether control signal $\phi_0$ or control signal $\phi_1$, respectively, directs the current through the differential pair of nodes by corresponding charge pump unit cells. Sharing of the same charge pump circuitry controlled by control signal $\phi_0$ or control signal $\phi_1$, results in intrinsic matching between current elements of DAC 126.

In an embodiment, n-type and p-type current sources of the charge pump are cascoded to increase output impedance, although cascode devices may be omitted to increase voltage headroom, which can be a concern in low power supply voltage applications. For example, bias signal BIASP controls a p-type current source and bias signal BIASP_CASC controls a cascode device corresponding to the p-type current source to increase output impedance. Similarly, bias signal BIASN controls an n-type current source and bias signal BIASN_CASC controls a cascode device corresponding to the n-type current source to increase output impedance. Those current sources control the variable current within the charge-box, and their performance corresponds to the effectiveness of the noise cancellation. In at least one embodiment, bias signals BIASP, BIASP_CASC, BIASN, BIASN_CASC are generated by charge pump bias generator 122, which is described further below, although other embodiments of a fractional-N frequency synthesizer use conventional bias signal generation techniques. In an embodiment, resistive degeneration techniques are used by the current sources to reduce the impact of charge-pump noise, e.g., 1/f noise.

In an embodiment, the output of charge-pump 104 is single-ended. The unused branch of the differential circuit is connected to node 220, which is referred to as a "dump node," having controlled voltage $V_{DUMP}$. In at least one embodiment, controlled voltage $V_{DUMP}$ is set to the same voltage level as common mode voltage $V_{CM}$ provided to operational amplifier 132 of loop filter 108. Maintaining these nodes at the same voltage level improves the switching performance of charge pump 104 by reducing voltage transients that could cause a change in unit element output current. When control signal $\phi_0$ is asserted, the charge-box is formed on node $V_{CA}$ according to select signals SEL$\phi_0$ [63:0]. When full-scale phase signal $\phi_1$ is asserted, a full-scale pulse of current is generated on node $V_{CA}$ according to select signals SEL$\phi_1$[63:0]. When control signal DOWN is asserted, a full-scale, negative pulse of current is generated on node $V_{CA}$ according to select signals SEL$\phi_1$[63:0].

In at least one embodiment, the shape of the charge-pump output waveform changes periodically during steady-state operation. Thus, the output of charge pump 104 contains some residual amount of energy at the fractional spur frequency. In addition, there is significant spurious content at the reference frequency. If charge-pump 104 passes its output directly to loop filter 108, residual fractional spurs and a significant reference spur will result. Instead, sample-and-hold network 106 is included to improve spurious performance of fractional-N frequency synthesizer 100 as compared to other conventional techniques. When at least one current element of charge pump 104 is active, sample switch 136 is open and the current sources of charge pump 104 charge or discharge capacitance $C_A$. When offset tri-state phase-frequency detector 102 and charge pump 104 complete operation, sample switch 136 is closed and op-amp summing junction 138 is coupled to capacitance $C_A$. Under steady-state operation, charge pump 104 transfers zero net charge to capacitance $C_A$ over each reference period, ignoring noise. By sampling after offset tri-state phase-frequency detector 102 and charge pump 104 completes operation, charge pump 104 does not transfer any charge to loop filter 108 in steady-state, voltage-controlled oscillator 120 sees no disturbance on its control voltage $V_{CTL}$, and spurs are reduced or eliminated.

Since the positive terminal of operational amplifier 132 is set to common mode voltage $V_{CM}$ and the negative terminal of operational amplifier 132 is also nominally at common mode voltage $V_{CM}$ (plus or minus any input offset in operational amplifier 132), the nominal voltage at the output of charge-pump 104 is also at common mode voltage $V_{CM}$. However, voltage $V_{CA}$ at the charge-pump output (e.g., node 134) will fall below common mode voltage $V_{CM}$ during normal operation. Since currents $I_{UP}$ and $I_{DOWN}$ may vary from their corresponding nominal values according to their corresponding output impedances of charge-pump 104, capacitance $C_A$ is selected to be large enough to constrain the voltage swing at node 134 so that current source output impedance does not adversely impact performance. Capacitance $C_A$ serves as an intermediate charge-transfer reservoir during transient events when a step in phase error causes the error charge magnitude to exceed the output drive capability of operational amplifier 132.

In an embodiment, the sampling operation is performed using complementary transmission gate switches with charge-balancing dummy devices. Because voltages $V_{CA}$ and $V_{CB}$ on nodes 134 and 138, respectively, settle to $V_{CM}$ every period before sampling is performed, the circuit acts as a constant sampling network, thereby reducing nonlinear effects associated with variable channel resistance in sample switches. In an embodiment, sample-and-hold network 106 is coupled to a differential-to-single-ended converter circuit. In at least one embodiment, the differential-to-single-ended converter has a dynamic topology that does not dissipate static power and generates coincident complementary full-swing output signals that are useful for charge-injection reduction. The coincident complementary full-swing output signals eliminate an extra inverter delay between an output and a complementary output signal that would otherwise cause a phase difference between overlap charge packets delivered through n-type and p-type transistors in transmission gates of switches 136 in sample-and-hold network 106. Coincident switching causes the device overlap capacitance charge injection to be in phase for the n-type and p-type devices of switches 136.

Figure 7:
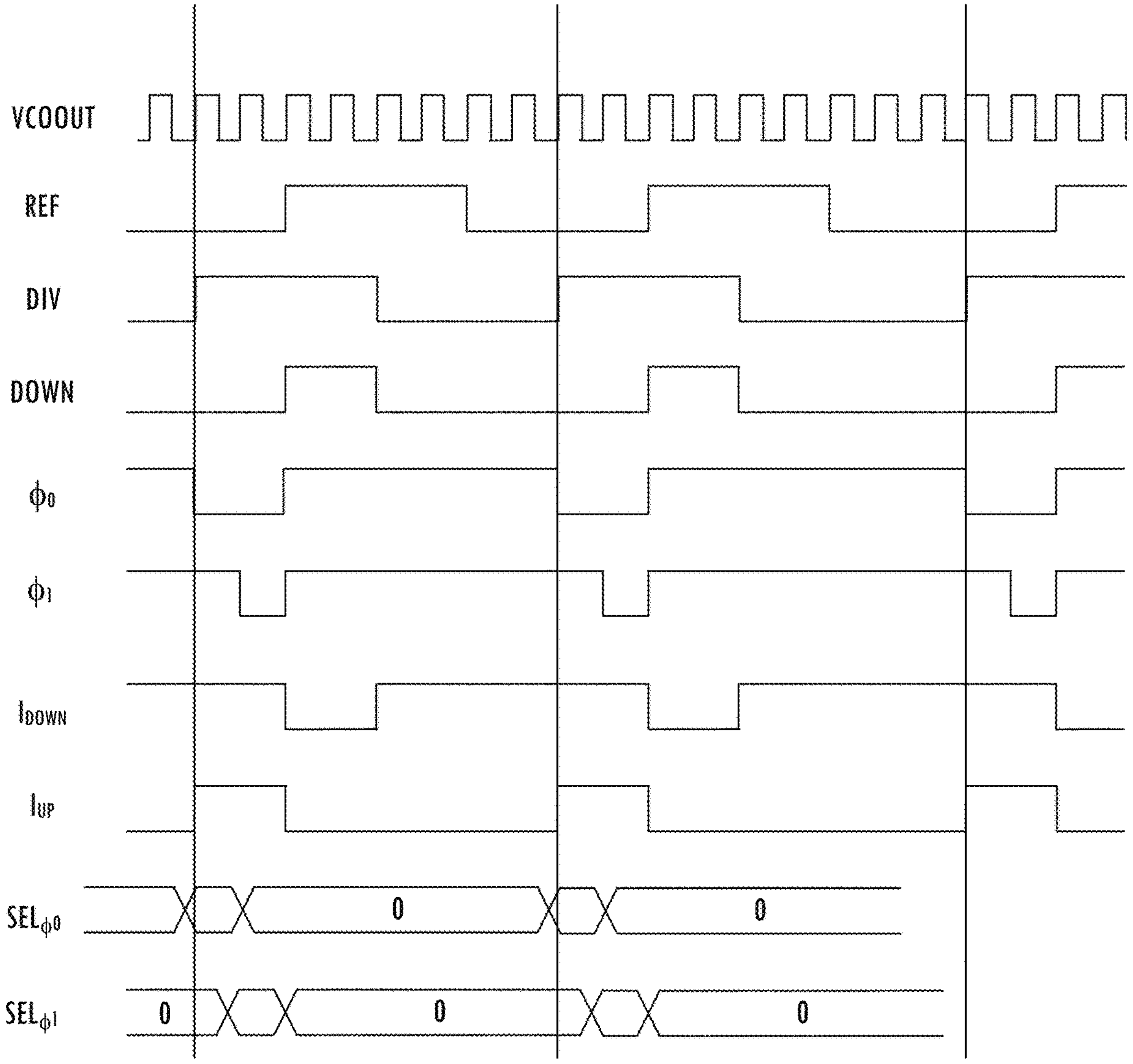
FIG. 7 illustrates signal waveforms for an embodiment of a fractional-N frequency synthesizer.

FIG. 7 illustrates exemplary control signal waveforms associated with fractional-N frequency synthesizer 100 of FIGS. 1-6. In at least one embodiment, when charge pump 104 switches from the error cancellation phase of error current generation (e.g., assertion of error cancellation phase signal $\phi_0$) to full-scale phase of error current generation (e.g., assertion of full-scale phase signal $\phi_1$), charge injection introduces a nonlinearity into the output of charge pump 104 and voltage $V_{CA}$, which degrades performance of fractional-N frequency synthesizer 100. A technique for reducing the effects of charge injection when charge pump 104 switches from the error cancellation phase of error current generation to a full-scale phase of error current generation uses a dummy digital-to-analog converter to steer excess current from the error cancellation phase to a voltage regulated node. As a result, the voltage swing of an inactive branch of a digital-to-analog converter in the charge pump is the same as the voltage swing of the active branch propagating charge to loop filter 108 via sample-and-hold network 106, i.e., the device overlap capacitance charge injection is in phase for the branches of a digital-to-analog converter in the charge pump, thereby reducing effects of charge injection.

Figure 8:
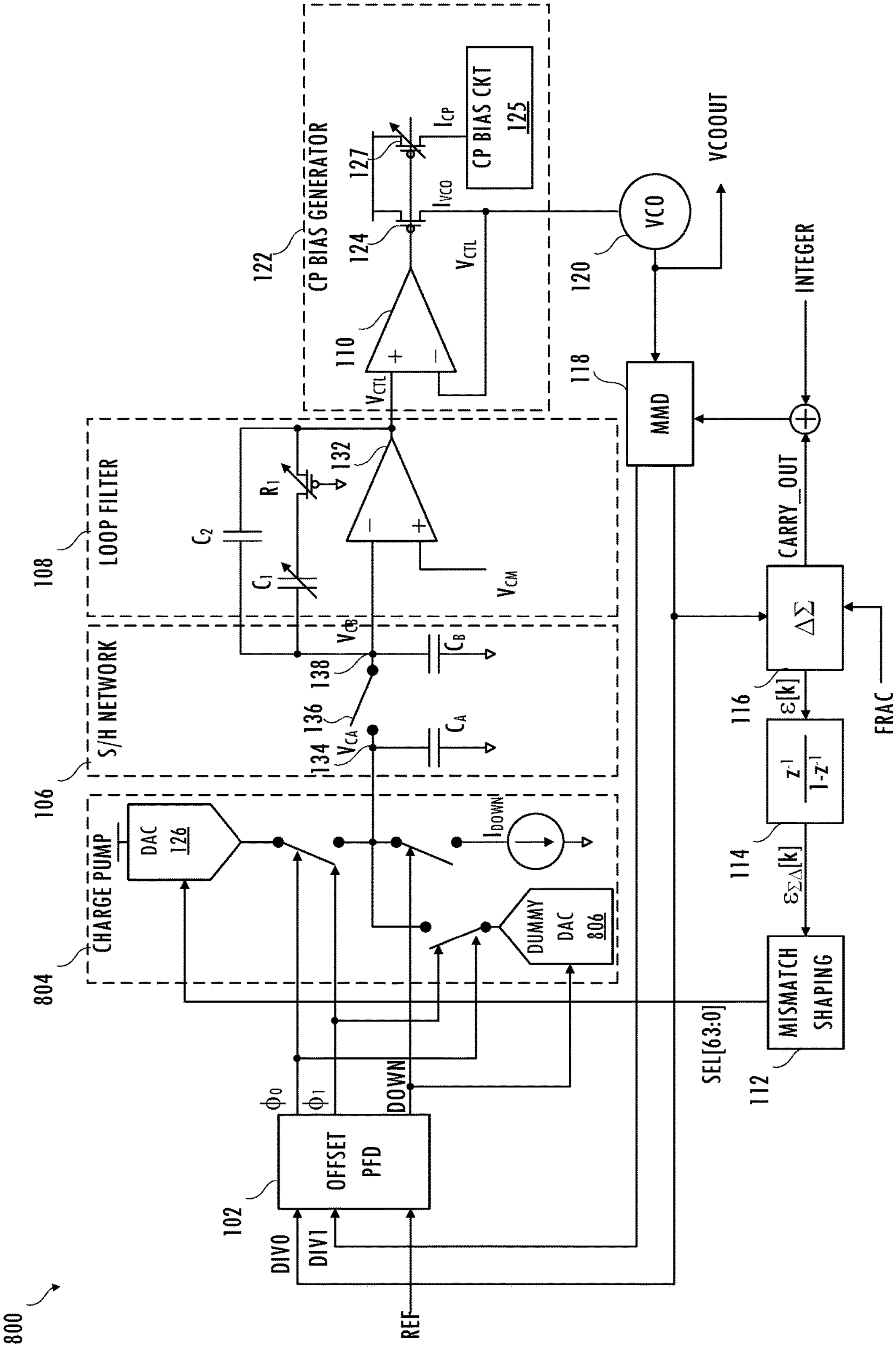
FIG. 8 illustrates a functional block diagram of an embodiment of a fractional-N frequency synthesizer including a charge pump having a dummy digital-to-analog converter.

Referring to FIG. 8, in at least one embodiment of fractional-N frequency synthesizer 800, offset tri-state phase-frequency detector 102 generates error cancellation phase signal $\phi_0$, full-scale phase signal $\phi_1$, and control signal DOWN, as described above with reference to fractional-N frequency synthesizer 100 of FIGS. 1-7. However, charge pump 804 of FIGS. 8 and 9 implements the digital-to-analog converter function with reduced or negligible effects from charge injection, as compared to charge pump 104 of FIGS. 1-7. To achieve the digital-to-analog conversion functionality with reduced or negligible effects from charge injection, like charge pump 104 of FIGS. 1 and 3, charge pump 804 of FIGS. 8 and 9 implements two charge pumps associated with the divider signals as a shared DAC current source that is controlled using select signals SEL$\phi_0$ and SEL$\phi_1$, which are based on a predicted value of the fractional phase error $\varepsilon[k]$. The value of $\varepsilon[k]$ is based on the residue of an accumulator used to dither a divider value consistent with conventional phase interpolation techniques.

Figure 9:
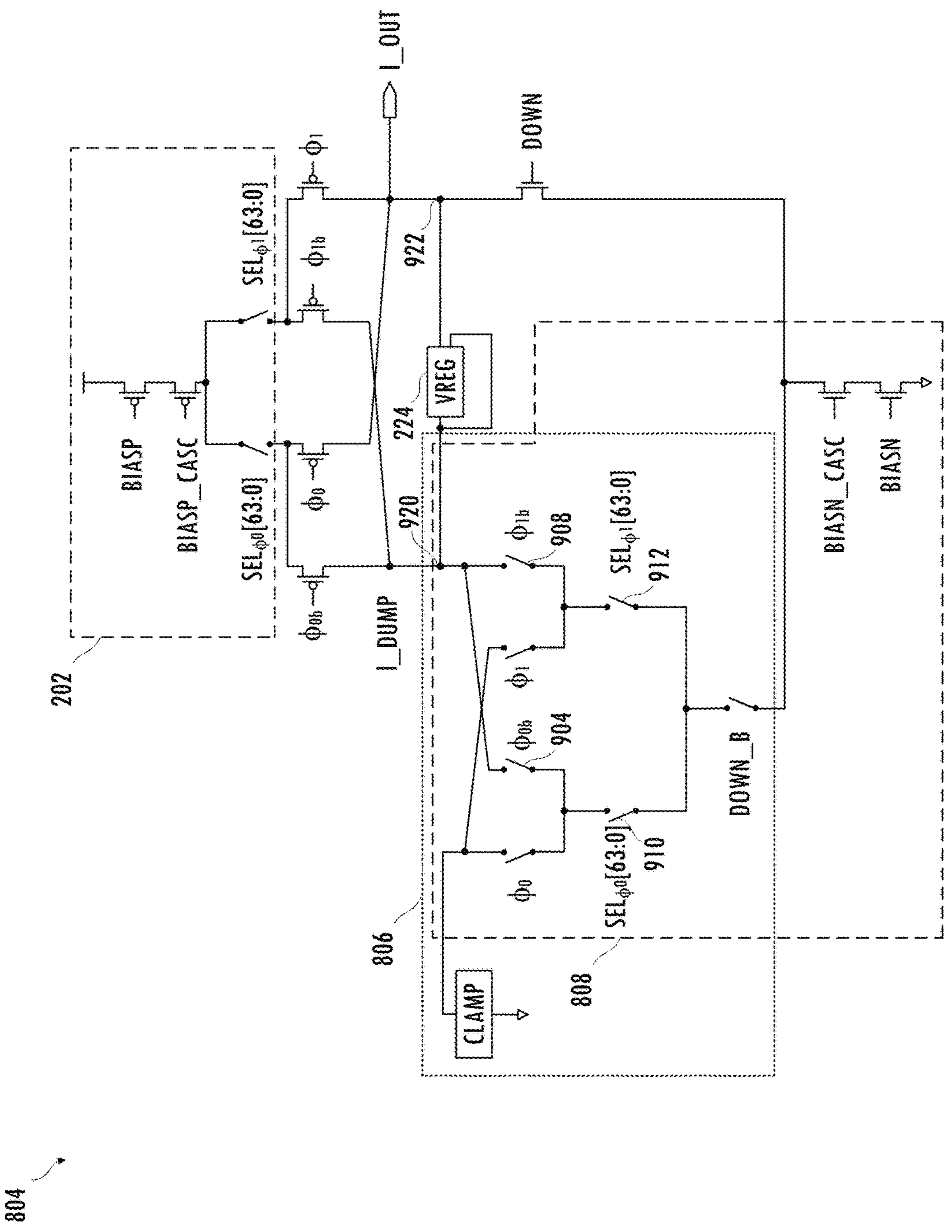
FIG. 9 illustrates a circuit diagram of an embodiment of a charge pump including a dummy digital-to-analog converter in an embodiment of a fractional-N frequency synthesizer.

Referring to FIGS. 8 and 9, like the charge pump described above, in an embodiment, the output of charge pump 804 is single ended. However, unlike the charge pump described above, the unused branch of charge pump 804 is coupled to dummy DAC 806. In at least one embodiment, the topology of dummy DAC 806 is complementary to the topology of DAC converter 126. In an embodiment, when error cancellation phase signal $\phi_0$ is asserted, a charge-box is formed on node $V_{CA}$ according to select signals SEL$\phi_0$[63:0]. However, when dummy DAC 806 does not provide a path from node 920 to ground (e.g., switches 904 and 912 are open), dummy DAC 806 steers excess current from node 920 to a well-controlled dumping ground by voltage regulator 202. When full-scale phase signal $\phi_1$ is asserted, a full-scale pulse is generated on node $V_{CA}$ according to select signals SEL$\phi_1$[63:0]. However, dummy DAC 806 does not provide a path from node 920 to ground (switches 908 and 910 are open) and excess current is steered from node 920 to a well-controlled dumping ground by voltage regulator 202. In at least one embodiment, controlled voltage $V_{DUMP}$ is set common mode voltage $V_{CM}$ provided to operational amplifier 132 of loop filter 108. Maintaining these nodes at the same voltage level improves the switching performance of charge pump 804 by reducing voltage transients that could cause a change in unit element output current.

By introducing dummy DAC 806 to steer the excess current from the error cancellation phase to a well-controlled dumping ground, the effect of charge injection is reduced or minimized since dummy DAC 806 causes the voltage swing of the inactive branch of digital-to-analog converter 126 to be the same as the voltage swing of the active branch propagating charge to loop filter 108 via sample-and-hold network 106. That is, the device overlap capacitance charge injection is in phase for nodes 920 and 922 of charge pump 804. Any common mode noise is attenuated by the differential structure of charge pump 804. In an embodiment of charge pump 804, circuit portion 202 and circuit portion 808 are instantiated for each individually selectable unit cell of the charge pump (e.g., 64 cells). Other circuitry of charge pump 804 is shared by the charge pump unit cells. In other embodiments, a complementary charge pump topology is used. For example, other embodiments of charge pump 804 include a dummy DAC coupled between node 920 and the power supply node via a p-type current source and a DAC coupled between nodes 920 and 922 and coupled to ground via an n-type current source to generate a positively charged pulse of fixed width according to an UP control signal and a negatively charged pulse of variable width according to error cancellation phase signal $\phi_0$ and full-scale phase signal $\phi_1$. In other embodiments, resistive degeneration techniques are used by both current sources to reduce the impact of charge-pump noise (e.g., 1/f noise) or cascode devices are excluded.

Figure 10:
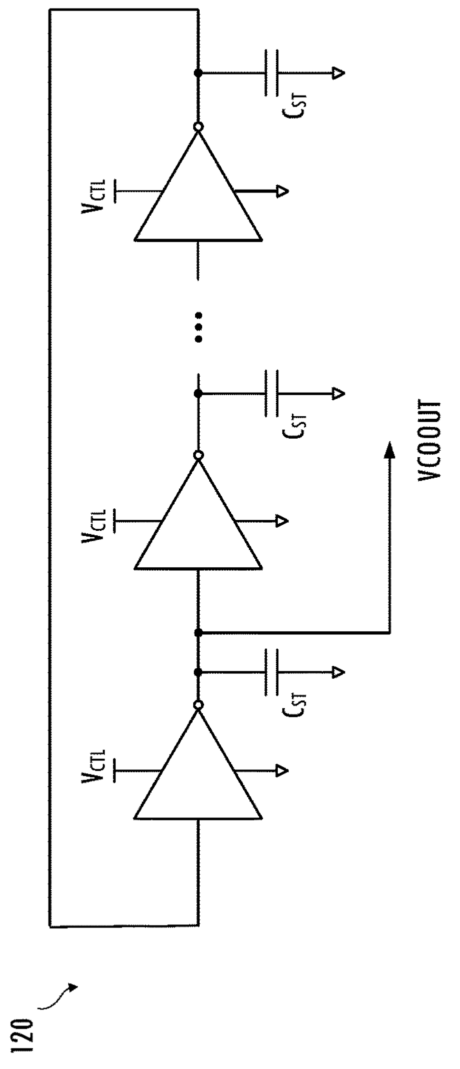
FIG. 10 illustrates a circuit diagram of an embodiment of a voltage-controlled oscillator in an embodiment of a fractional-N frequency synthesizer.

Referring to FIGS. 1, 8, and 10, in at least one embodiment of a fractional-N frequency synthesizer, VCO 120 is implemented using a ring-oscillator realized by $N_{st}$ inverter stages, where $N_{st}$ is an odd integer. In an embodiment, loop bandwidth @N is set to $\omega_{ref}/10$ or $\omega_{ref}/25$ and damping factor $\zeta$ is set to no lower than 50 degrees phase margin. A technique for reducing effects of process, voltage, and temperature (PVT) variations on the performance of the fractional-N frequency synthesizer includes making loop parameters, e.g., damping factor $\zeta$ and loop bandwidth $\omega_N$, independent of variations in PVT. By making the loop parameters a multiple of frequency $f_{REF}$ and a ratio of components (e.g., $C_1/C_{st}$, where capacitance $C_{st}$ represents the load of each stage of the ring oscillator of VCO 120) and self-biasing the phase-locked loop, the technique makes the ratio of loop bandwidth $\omega_N$ to the operating frequency $f_{CLKOUT}$ constant in response to PVT variations.

In an embodiment of the phase-locked loop of a fractional-N frequency synthesizer, loop bandwidth $\omega_N$ can be represented as:

$$\omega_N = \sqrt{\frac{I_{cp}K_{VCO}}{NC_1}},$$

where N is the frequency divider value, $K_{VCO}$ is the gain of VCO 120 and $C_1$ is the capacitance that is coupled in series with selectable resistor having resistance $R_1$ in loop filter 108. Charge pump current $I_{CP}$, which is used to bias charge pump 104 or charge pump 804, is a ratiometric replica of current $I_{VCO}$, i.e., $\alpha = I_{CP}/I_{VCO}$. Thus, $$\omega_N = \sqrt{\frac{\alpha I_{VCO} k_{VCO}}{NC_1}}.$$

Current $I_{VCO}$ has the following relationship:

$$I_{VCO} = C_{st} V_{CTL} f_{CLKOUT}.$$

Therefore, the loop bandwidth can be represented by $$\omega_N = \sqrt{\frac{\alpha V_{CTL} f_{CLKOUT} K_{VCO}}{N}\left(\frac{C_{st}}{C_1}\right)}.$$

When $C_1$ is designed to be a replica of capacitance $C_{st}$ and $$f_{CLKOUT}=\frac{1}{2N_{st}\tau_d}=\frac{I_{st}}{2N_{st}C_{st}V_{CTL}}\sim\frac{V_{CTL}}{2N_{st}C_{st}}\left(\because I_{st}\propto V_{CTL}^2\right),$$

Therefore, current $I_{st}$ is proportional to $V_{CTL}^2$, where $I_{st}$ is the current of each stage of the ring oscillator in VCO 120, and the gain of VCO 120 is $$K_{VCO}=\frac{df}{dV_{CTL}}=\frac{1}{2N_{st}C_{st}}=\frac{f_{CLKOUT}}{V_{CTL}}.$$

Accordingly, loop bandwidth $\omega_N$ becomes $$\omega_N=\sqrt{\frac{\alpha V_{CTL}f_{CLKOUT}\left(\frac{f_{CLKOUT}}{V_{CTL}}\right)}{N}\left(\frac{C_{st}}{C_1}\right)}.$$

Since $$f_{CLKOUT}=Nf_{Ref},$$

the loop bandwidth can be represented as $$\omega_N=\sqrt{\frac{\alpha N^2f_{ref}^2}{N}\left(\frac{C_{st}}{C_1}\right)}.$$

If N changes, then $\alpha$ must also change inversely proportionally to the change in N. By using a ratiometric replica of current $I_{VCO}$ to bias charge pump 104 or charge pump 804, loop bandwidth $\omega_N$ has the following relationship:

$$\omega_N=f_{ref}\sqrt{(\alpha N)\left(\frac{C_{st}}{C_1}\right)},$$

and the loop bandwidth is a multiple of frequency $f_{ref}$ and has first-order independence from PVT variations.

In an embodiment of the phase-locked loop of a fractional-N frequency synthesizer, damping factor $\zeta$ can be represented as $$\zeta=\frac{1}{2}R_1C_1\omega_N\Rightarrow R_1=\frac{2\zeta}{C_1\omega_N}.$$

By substituting loop bandwidth $\omega_N$ with the representation derived above, $$R_1=\frac{2\zeta}{C_1f_{ref}}.$$

Since $f_{CLKOUT}=f_{ref}\times N$, $$R_1=\frac{N\times2\zeta}{C_1f_{CLKOUT}}.$$

Since $$f_{CLKOUT}=\frac{1}{2N_{st}\tau_d}=\frac{I_{st}}{2N_{st}C_{st}V_{CTL}}\sim\frac{V_{CTL}}{2N_{st}C_{st}},$$

$$R_1\propto\frac{N}{C_1\left(\frac{V_{CTL}}{C_{st}}\right)},\text{ and}$$

$$R_1\propto\frac{N}{V_{CTL}\left(\frac{C_1}{C_{st}}\right)}.$$

By making $R_l$ inversely proportional to $V_{CTL}$ and if $R_l$ is selected to be directly proportionally to variations in N, damping factor $\zeta$ has first-order independence from PVT variations.

Figure 11:
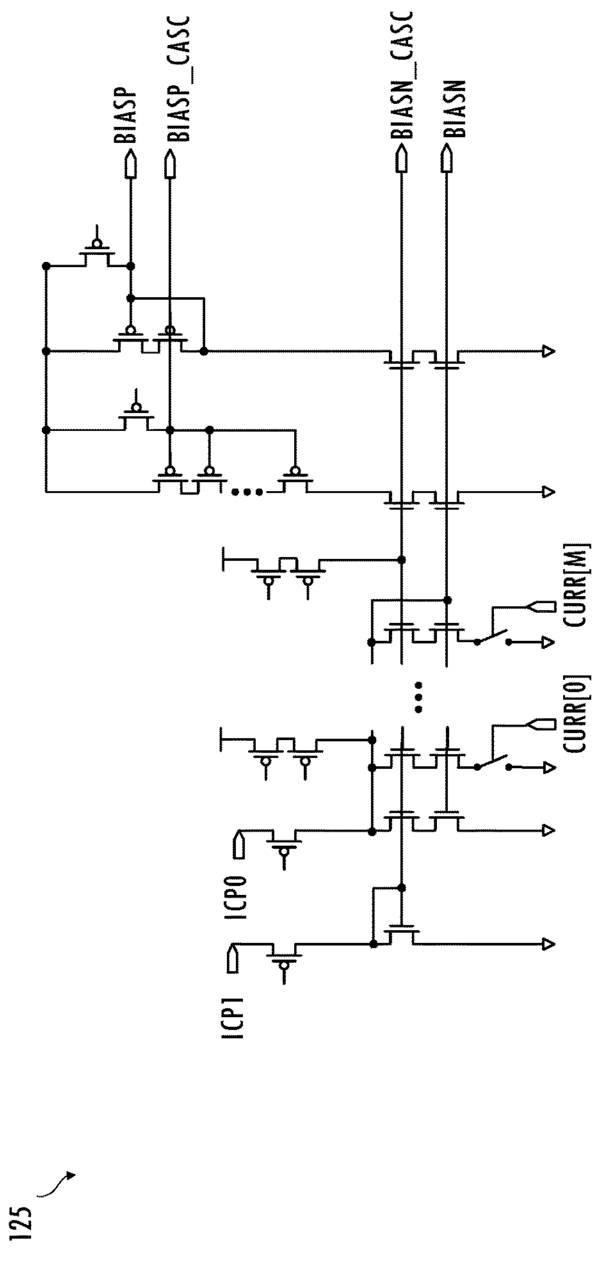
FIG. 11 illustrates a circuit diagram of an embodiment of a charge pump bias signal generator in an embodiment of a fractional-N frequency synthesizer.

Referring to FIGS. 1, 8, and 11, embodiments of 100 and 800 have damping factor $\zeta$ and loop bandwidth $\omega_N$ with first-order independence from PVT variations. For example, in at least one embodiment, charge pump bias generator 122 includes unity gain buffer 110 and transistors 124 and 127 to generate current $I_{VCO}$ based on control voltage $V_{CTL}$ and to generate current $I_{CP}$, which is a ratiometric replica of current $I_{VCO}$. Bias circuit 125 uses current $I_{CP}$ to generate bias signals for charge pump 104 or charge pump 804, as the case may be, to achieve first-order independence of loop bandwidth $\omega_N$ from PVT variations, regardless of oscillator gain variation. In at least one embodiment, to make current $I_{CP}$ vary according to $\alpha$, which varies inversely proportionally to a change in frequency divider value N, charge pump bias generator 122 includes variable transistor 127. In an embodiment, variable transistor 127 is implemented by a plurality of p-type transistors coupled in parallel and selectively enabled by a corresponding control code to generate current $I_{CP}$ according to $\alpha$, which varies inversely proportionally to frequency divider value N.

As described above, the number of active current cells of charge pump 104 or charge pump 804 are selected according to the frequency divider value N to achieve frequency independence using select signals SEL [63:0], which in some embodiments of charge pump 104 or charge pump 804 are implemented as SELQ$\phi_0$[63:0] and select signals SEL$\phi_1$ [63:0]. In addition, in at least one embodiment of charge pump bias generator 122, variable transistor 127 provides current ICPO and ICP1 to bias circuit 125. Bias circuit 125 uses current ICP0 to generate voltages BIASN and BIASP and uses current ICP1 to generate voltages BIASN_CASC and BIASP_CASC. In an embodiment, bias circuit 125 includes a selectable current mirror that adjusts the bias voltages according to a control code corresponding to frequency divider value N. For example, control code CURR [0: M] is set according to frequency divider value N to select a corresponding number of mirror elements used to generate voltages BIASN, BIASP, BIASN_CASC, and BIASP_CASC. Bias circuit 125 is exemplary only and other current mirror topologies may be used to generate voltages BIASN, BIASP, BIASN_CASC, and BIASP_CASC.

In at least one embodiment of loop filter 108, resistance $R_1$ is realized using a selectable number of transistors coupled in parallel and configured in a triode region of MOSFET operation. The number of transistors is selected using a control code corresponding to frequency divider value N to make resistance $R_1$ change directly proportionally with changes in N to achieve frequency independence. The transistors are coupled between capacitance $C_1$ and the output of operational amplifier 132, i.e., the transistors are coupled to the control voltage $V_{CTL}$. Thus, resistance $R_1$ is inversely proportional to control voltage $V_{CTL}$ and is directly proportional to the integer portion of frequency divider value N. As a result, damping factor ζ has first-order independence from PVT variations. In at least one embodiment of loop filter 108, capacitance $C_1$ is designed to be a replica of the self-loading of a delay stage of the ring oscillator in VCO 120. That is, capacitance $C_1$ has the same device characteristics as capacitance $C_{st}$ and varies in the same way as capacitance $C_{st}$ in response to variations in PVT, causing the ratio of $C_1/C_{st}$ to be fixed.

Thus, techniques that significantly reduce the need for calibration circuits and techniques to improve operation of phase-locked loops using VCOs implemented by ring oscillators in response to variations in PVT. The description of the invention set forth herein is illustrative and is not intended to limit the scope of the invention as set forth in the following claims. For example, while the invention has been described in an embodiment in which a fractional-N frequency synthesizer is described, one of skill in the art will appreciate that the teachings herein can be utilized with other clock generators or other circuits including phase-locked loops. The terms “first,” “second,” “third,” and so forth, as used in the claims, unless otherwise clear by context, are to distinguish between different items in the claims and do not otherwise indicate or imply any order in time, location or quality. For example, “a first received signal” and “a second received signal, ” do not indicate or imply that the first received signal occurs in time before the second received signal. Variations and modifications of the embodiments disclosed herein may be made based on the description set forth herein, without departing from the scope of the invention as set forth in the following claims.

What is claimed is:

1. A method for fractional-N frequency synthesis, the method comprising:
- generating a charge-pump current using a bias signal generated based on a control voltage of a voltage-controlled oscillator of a phase-locked loop and a frequency divider value of the phase-locked loop; and
- generating the bias signal according to a current based on the control voltage and according to a control code corresponding to the frequency divider value of the phase-locked loop.

2. The method as recited in claim 1 further comprising:
- providing the bias signal to a current generation circuit in a charge pump of the phase-locked loop; and
- generating an additional bias signal for a cascode device of the current generation circuit in the charge pump, the additional bias signal being generated based on the control voltage and the frequency divider value.

3. The method as recited in claim 1 further comprising:
- generating a second bias signal for a charge pump, the bias signal corresponding to a current source of the charge pump and the second bias signal corresponding to a current sink of the charge pump.

4. The method as recited in claim 3 further comprising:
- generating a third bias signal for a cascode device in the current source and a fourth bias signal for a second cascode device in the current sink, the third bias signal and the fourth bias signal being generated based on the control voltage and the frequency divider value.

5. The method as recited in claim 1 further comprising:
- generating the control voltage based on the charge-pump current and using a loop filter capacitance and a selected loop filter resistance.

6. The method as recited in claim 5 further comprising:
- configuring the selected loop filter resistance according to the frequency divider value, the selected loop filter resistance varying according to variation of the control voltage.

7. The method as recited in claim 5 wherein the loop filter capacitance is a replica of a load of an individual stage of a ring oscillator of the voltage-controlled oscillator.

8. A fractional-N frequency synthesizer comprising:
- a phase-locked loop comprising:
  - a charge pump comprising a current generation circuit responsive to a bias signal; and
  - a voltage-controlled oscillator responsive to a control signal; and
- a bias signal generator configured to generate the bias signal based on the control signal and a frequency divider value,
- wherein the bias signal generator comprises a selectable current mirror configured to generate the bias signal according to a current based on the control signal and a control code corresponding to the frequency divider value.

9. The fractional-N frequency synthesizer as recited in claim 8 wherein the phase-locked loop further comprises:
- a loop filter configured to generate the control signal,
- wherein the loop filter comprises:
  - a loop filter capacitance; and
  - a selectable loop filter resistance.

10. The fractional-N frequency synthesizer as recited in claim 9 wherein the selectable loop filter resistance is configured according to the frequency divider value and varies according to variation of the control signal.

11. The fractional-N frequency synthesizer as recited in claim 9 wherein the loop filter capacitance is a replica of a load of an individual stage of a ring oscillator of the voltage-controlled oscillator.

12. The fractional-N frequency synthesizer as recited in claim 8 wherein the selectable current mirror is further configured to generate a cascode bias signal according to the current based on the control signal and the control code corresponding to the frequency divider value.

13. The fractional-N frequency synthesizer as recited in claim 12 wherein the bias signal and the cascode bias signal correspond to a first current generation circuit in a digital-to-analog converter of the charge pump and the selectable current mirror is further configured to generate a second bias signal and a second cascode bias signal corresponding to a second current generation circuit in a dummy digital-to-analog converter of the charge pump.

14. The fractional-N frequency synthesizer as recited in claim 8 wherein the bias signal generator comprises a circuit configured to generate a current based on the control signal and further based on a scaling factor.

15. The fractional-N frequency synthesizer as recited in claim 8 wherein the charge pump comprises a digital-to-analog converter having a plurality of current generation cells, each current generation cell of the plurality of current generation cells being responsive to the bias signal and a corresponding selection control signal.

16. A method for fractional-N frequency synthesis, the method comprising:
- generating a control voltage for a voltage-controlled oscillator in a phase-locked loop based on an output of a charge pump, the control voltage being generated using a loop filter capacitance that is a replica of a load of an individual stage of a ring oscillator of the voltage-controlled oscillator and using a selectable loop filter resistor configured according to a frequency divider value, the selectable loop filter resistor having a resistance that is a function of the control voltage.

17. The method as recited in claim 16 further comprising:

generating a bias signal based on the control voltage and the frequency divider value; and generating the output of the charge pump based on the bias signal.

18. The method as recited in claim 17 further comprising:

generating an additional bias signal for a cascode device of a current generation circuit of the charge pump, the additional bias signal being generated based on the control voltage and the frequency divider value, wherein the output of the charge pump is further based on the additional bias signal.

* * * * *